United States Patent
Chung

(10) Patent No.: US 8,546,932 B1
(45) Date of Patent: Oct. 1, 2013

(54) THIN SUBSTRATE POP STRUCTURE

(75) Inventor: Chih-Ming Chung, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/586,375

(22) Filed: Aug. 15, 2012

(51) Int. Cl.
*H01L 23/02* (2006.01)
*H01L 21/00* (2006.01)

(52) U.S. Cl.
USPC ............ 257/686; 257/E25.006; 257/E25.013; 257/E25.021; 257/E25.027; 257/E23.085; 438/109

(58) Field of Classification Search
USPC .................. 257/686, 777, E25.006, E25.013, 257/E25.021, E25.027, E23.085; 438/109
See application file for complete search history.

(56) References Cited

U.S. PATENT DOCUMENTS

| | | | |
|---|---|---|---|
| 6,150,730 A | 11/2000 | Chung et al. | |
| 6,201,299 B1 | 3/2001 | Tao et al. | |
| 6,921,968 B2 | 7/2005 | Chung | |
| 7,098,071 B2 | 8/2006 | Ho et al. | |
| 7,125,745 B2 | 10/2006 | Chen et al. | |
| 7,163,840 B2 | 1/2007 | Chen et al. | |
| 7,262,510 B2 | 8/2007 | Chung | |
| 7,327,018 B2 | 2/2008 | Chung | |
| 7,375,435 B2 | 5/2008 | Wang et al. | |
| 7,482,200 B2 | 1/2009 | Chung | |
| 7,528,474 B2 * | 5/2009 | Lee ............................. 257/686 |
| 7,565,737 B2 | 7/2009 | Chung | |
| 7,834,469 B2 | 11/2010 | Chuang et al. | |
| 7,986,035 B2 | 7/2011 | Miyagawa | |
| 8,017,448 B2 | 9/2011 | Ino | |
| 8,409,923 B2 * | 4/2013 | Kim et al. ..................... 438/109 |
| 2009/0267210 A1 | 10/2009 | Chuang et al. | |
| 2009/0278243 A1 | 11/2009 | Chuang et al. | |
| 2010/0123235 A1 * | 5/2010 | Kim et al. ..................... 257/686 |
| 2010/0213898 A1 | 8/2010 | Hayashigawa | |
| 2011/0068481 A1 | 3/2011 | Park et al. | |
| 2011/0140258 A1 | 6/2011 | Do et al. | |
| 2011/0309893 A1 | 12/2011 | Kawamura et al. | |
| 2012/0025398 A1 | 2/2012 | Jang et al. | |
| 2012/0032341 A1 | 2/2012 | Chao et al. | |
| 2012/0049338 A1 | 3/2012 | Chen et al. | |
| 2012/0068319 A1 | 3/2012 | Choi et al. | |
| 2012/0086003 A1 | 4/2012 | Park | |

OTHER PUBLICATIONS

U.S. Appl. No. 13/627,905, filed Sep. 26, 2012, inventor Zhao et al.

* cited by examiner

*Primary Examiner* — Jasmine Clark
(74) *Attorney, Agent, or Firm* — Lawrence J. Merkel; Garteh Sampson; Meyertons, Hood, Kivlin, Kowert & Goetzel P.C.

(57) ABSTRACT

A PoP (package-on-package) package includes a bottom package with a substrate encapsulated in an encapsulant with a die coupled to the top of the substrate. At least a portion of the die is exposed above the encapsulant on the bottom package substrate. A top package includes a substrate with encapsulant on both the frontside and the backside of the substrate. The backside of the top package substrate is coupled to the topside of the bottom package substrate with at least part of the die being located in a recess in the encapsulant on the backside of the top package substrate.

23 Claims, 2 Drawing Sheets

THIN SUBSTRATE POP STRUCTURE

BACKGROUND

1. Field of the Invention

The present invention relates to semiconductor packaging and methods for packaging semiconductor devices. More particularly, the invention relates to a PoP (package-on-package) using thin or coreless substrates.

2. Description of Related Art

Package-on-package ("PoP") technology has become increasingly popular as the demand for lower cost, higher performance, increased integrated circuit density, and increased package density continues in the semiconductor industry. As the push for smaller and smaller packages increases, the integration of die and package (e.g., "pre-stacking" or the integration of system on a chip ("SoC") technology with memory technology) allows for thinner packages. Such pre-stacking has become a critical component for thin and fine pitch PoP packages.

A problem that arises with thin and fine pitch PoP packages is the potential for warping as the pitch is reduced between terminals (e.g., balls such as solder balls) on either the top package or the bottom package in the PoP package. Warping may be caused by the difference in thermal characteristics of materials used in the package (e.g., the substrate and an encapsulant applied to the substrate). The top package may especially have warping problems due to the top package not being attached to any external component that inhibits warping. For example, the bottom package may be attached to a printed circuit board that helps to inhibit warping in the bottom package.

The warping problem in the top package may be further increased with the use of a thin or coreless substrate in the top package. The thin or coreless substrate may have less mechanical strength to resist the effects caused by differences in thermal characteristics between the substrate and the applied encapsulant. The warping problem may lead to failure or reduced performance of the PoP package and/or problems in reliability of devices utilizing the PoP package.

SUMMARY

In certain embodiments, an assembly system for a PoP package includes a bottom package and a top package. The bottom package may include a substrate coupled to a die. The substrate and the die may be encapsulated in an encapsulant with at least part of the die being exposed above the encapsulant. At least a portion of the die is exposed above the encapsulant on the bottom package substrate. The top package may include a substrate with encapsulant on both the frontside (top) and the backside (bottom) of the substrate. Because of the encapsulant on both sides of the top package, thermal properties in the top package may be substantially balanced. Balancing the thermal properties may balance thermal stresses on the top package and reduce or inhibit warping in the top package.

In certain embodiments, the encapsulant on the backside of the top package substrate includes a recess. In some embodiments, at least part of the substrate is exposed in the recess. In other embodiments, the substrate is substantially covered in the recess. In certain embodiments, when the bottom package and the top package are coupled to form a PoP package, the recess in the top package accommodates the die coupled to the substrate in the bottom package (e.g., at least part of the die is located in the recess). In some embodiments, terminals (e.g., solder balls) on the top of the bottom package substrate are coupled to terminals on the bottom of the top package substrate when the bottom package is coupled to the top package.

BRIEF DESCRIPTION OF THE DRAWINGS

Features and advantages of the methods and apparatus of the present invention will be more fully appreciated by reference to the following detailed description of presently preferred but nonetheless illustrative embodiments in accordance with the present invention when taken in conjunction with the accompanying drawings in which.

Figure 1:
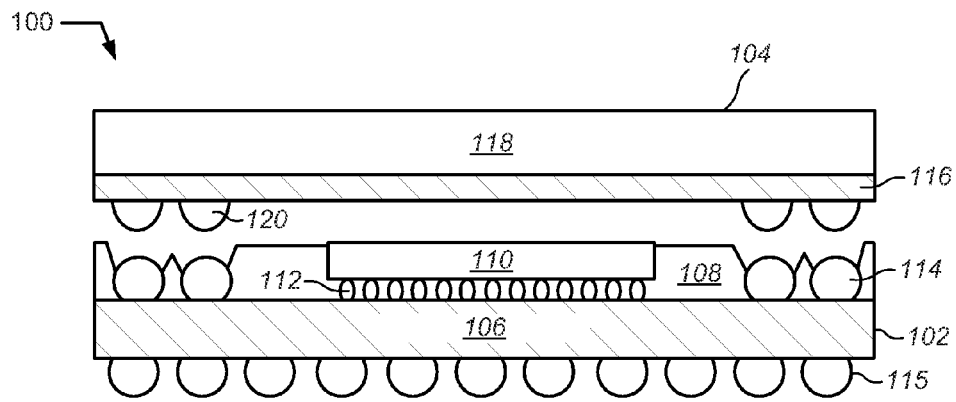
FIG. 1 depicts a cross-sectional representation of an example of top and bottom packages for PoP ("package-on-package") package before assembly.

While the invention is susceptible to various modifications and alternative forms, specific embodiments thereof are shown by way of example in the drawings and will herein be described in detail. The drawings may not be to scale. It should be understood that the drawings and detailed description thereto are not intended to limit the invention to the particular form disclosed, but to the contrary, the intention is to cover all modifications, equivalents and alternatives falling within the spirit and scope of the present invention as defined by the appended claims.

DETAILED DESCRIPTION OF EMBODIMENTS

FIG. 1 depicts a cross-sectional representation of an example of top and bottom packages for a PoP ("package-on-package") package before assembly (e.g., a PoP package system). PoP package assembly system 100 includes bottom package 102 and top 104. Bottom package 102 includes substrate 106 with encapsulant 108 at least partially covering the substrate. Die 110 may be coupled to substrate 106 using terminals 112 (e.g., solder balls) and be at least partially covered in encapsulant 108. Terminals 114 (e.g., solder balls) may be coupled to an upper (top) surface of substrate 106. Terminals 115 (e.g., solder balls) may be coupled to a lower (bottom) surface of substrate 106.

Top package 104 includes substrate 116 with encapsulant 118 covering an upper (top) surface of the substrate. Terminals 120 (e.g., solder balls) are coupled to a lower (bottom) surface of substrate 116. As shown in FIG. 1, top package 104 may undergo warping because of the different thermal characteristics (e.g., coefficient of thermal expansion ("CTE") and/or shrinkage rate) between substrate 116, encapsulant 118, and terminals 120. Warping may cause problems such as, but not limited to, loss of connection between terminals 114 in bottom package 102 and terminals 120 in top package 104 after assembly of the PoP package. The warping problem in top package 104 may be increased if substrate 116 is a relatively thin substrate (e.g., less than about 400 µm in thickness) and/or the substrate is a coreless substrate (e.g., a substrate made of only dielectric polymer and copper traces).

Figure 2:
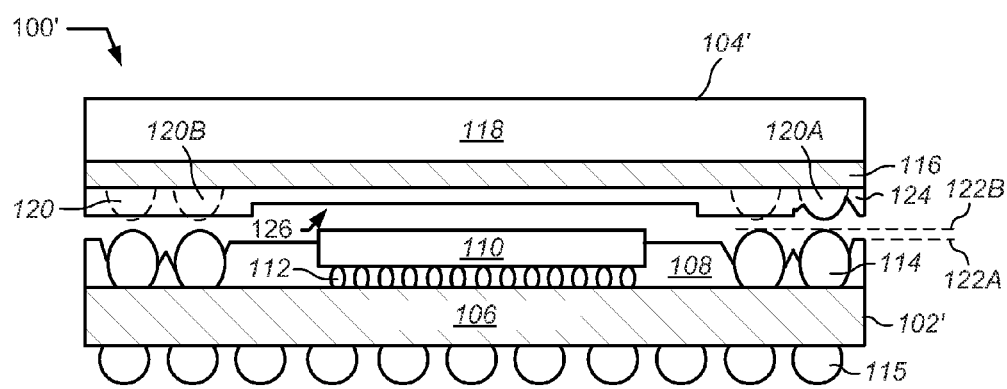
FIG. 2 depicts a cross-sectional representation of an embodiment of a PoP package assembly system.

FIG. 2 depicts a cross-sectional representation of an embodiment of PoP ("package-on-package") package assembly system 100'. System 100' includes bottom package 102' and top package 104'. In certain embodiments, bottom package 102' includes substrate 106. Substrate 106 may be, for example, a base substrate for a package or a package substrate. In certain embodiments, substrate 106 is a coreless substrate. In some embodiments, substrate 106 is a thin substrate with a core. Substrate 106 may have a thickness of less than about 400 μm. In some embodiments, the thickness of substrate 106 is less than about 200 μm or less than about 100 μm.

Die 110 may be coupled to an upper (top, topside, or frontside) surface of substrate 106 using terminals 112 and/or other mechanisms for coupling a die to a substrate. Die 110 may be, for example, a semiconductor chip, an integrated circuit die, or a flip chip die. In certain embodiments, die 110 is a system on a chip ("SoC"). In certain embodiments, terminals 114 are coupled to the top of substrate 106. Terminals 115 may be coupled to a lower (bottom, bottomside, or backside) surface of substrate 106. Terminals 112, 114, and/or 115 may include, but not be limited to, balls, pillars, or columns made from, for example, solder or copper.

After die 110 and terminals 114 are coupled to substrate 106, the top (e.g., upper surface) of the substrate may be at least partially covered by encapsulant 108. Encapsulant 108 may be, for example, a polymer or a mold compound. In certain embodiments, encapsulant 108 has selected properties (e.g., selected thermal properties). For example, in some embodiments, encapsulant 108 has a glass transition temperature ($T_g$) of between about 115° C. and about 190° C. In some embodiments, encapsulant 108 has a coefficient of thermal expansion (CTE) of between about 10 ppm/° C. and about 38 ppm/° C. below the glass transition temperature and between about 40 ppm/° C. and about 145 ppm/° C. above the glass transition temperature. In some embodiments, encapsulant 108 has a modulus between about 570 kgf/mm$^2$ and about 2400 kgf/mm$^2$ at 25° C. or between about 8 kgf/mm$^2$ and about 70 kgf/mm$^2$ at about 260° C. In certain embodiments, encapsulant 108 has thermal properties that are as close to the thermal properties of substrate 106 as possible.

Figure 3:
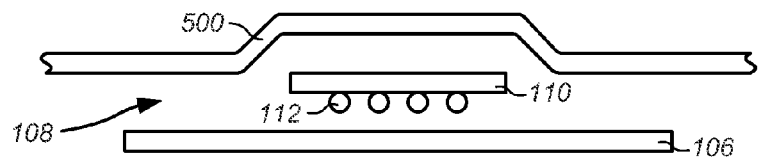
FIG. 3 depicts a side-view representation of a mold chase being used during application of encapsulant over a substrate.

In certain embodiments, die 110 is at least partially covered in encapsulant 108 and at least a portion of the die is exposed above the encapsulant, as shown in FIG. 2. In certain embodiments, a mold chase is used to form encapsulant 108 over substrate 106. FIG. 3 depicts a side-view representation of mold chase 500 being used during application of encapsulant 108 over substrate 106. As shown in FIG. 3, mold chase 500 has a shape that, when the mold chase is placed against die 110, inhibits encapsulant 108 from covering the top surface of the die. In some embodiments, a protective film is placed over the top surface of die 110 during the encapsulation process. The protective film may protect die 110 from damage when the die contacts mold chase 500. The protective film may be, for example, a polymer film.

In certain embodiments, as shown in FIG. 2, terminals 114 are at least partially covered by encapsulant 108. For example, at least a portion of terminals 114 is exposed above encapsulant 108, as shown in FIG. 2. In some embodiments, terminals 114 are first covered by encapsulant 108 when the encapsulant is applied to substrate 106 and then a portion of the encapsulant is removed to expose portions of the terminals. For example, terminals 114 may be exposed in a cavity, as shown in FIG. 2, using techniques such as, but not limited to, laser drilling/ablation to expose portions of the terminals. In other embodiments, portions of terminals 114 are exposed using flat-type processing such as, but not limited to, mechanical grinding/cutting processing. In some embodiments, a film assistance mold (FAM) process is used to form encapsulant 108 in a mold shape that exposes portions of terminals 114 (e.g., the mold shape has cavities for the terminals as shown in FIG. 2).

In certain embodiments, terminals 114 have a height above substrate 106, represented by dashed line 122B, that is higher than a height of encapsulant 108 above the substrate, represented by dashed line 122A. Terminals 114 may have a higher height than encapsulant 108 to ensure connection between the terminals in bottom package 102' and terminals (e.g., terminals 120) in top package 104'.

In certain embodiments, top package 104' includes substrate 116. Substrate 116 may be, for example, a base substrate for a package or a package substrate. In certain embodiments, substrate 116 is a coreless substrate. In some embodiments, substrate 116 is a thin substrate with a core. Substrate 116 may have a thickness of less than about 400 μm. In some embodiments, the thickness of substrate 116 is less than about 200 μm or less than about 100 μm.

In certain embodiments, terminals 120 are coupled to a lower (bottom, bottomside, or backside) surface of substrate 116. Terminals 120 may include, but not be limited to, balls, pillars, or columns made from, for example, solder or copper. Terminals 120 may be aligned to connect with terminals 114 in bottom package 102'.

An upper (top, topside, or frontside) surface of substrate 116 may be at least partially covered by encapsulant 118. Encapsulant 118 may be the same material as encapsulant 108 and/or have similar properties to encapsulant 108. In some embodiments, encapsulant 118 substantially covers the entire top of substrate 116, as shown in FIG. 2.

In certain embodiments, as shown in FIG. 2, the bottom of top package 104' is at least partially covered by encapsulant 124. Encapsulant 124 may be the same material and/or have similar properties as encapsulant 108 and/or encapsulant 118. In certain embodiments, recess 126 is formed in encapsulant 124. In some embodiments, recess 126 is formed during the encapsulation/molding process (e.g., using a mold chase cavity designed with the recess). In other embodiments, recess 126 is formed after the encapsulation/molding process. For example, recess 126 may be formed using mechanical grinding/cutting processes or laser drilling/ablation processes.

Figure 4:
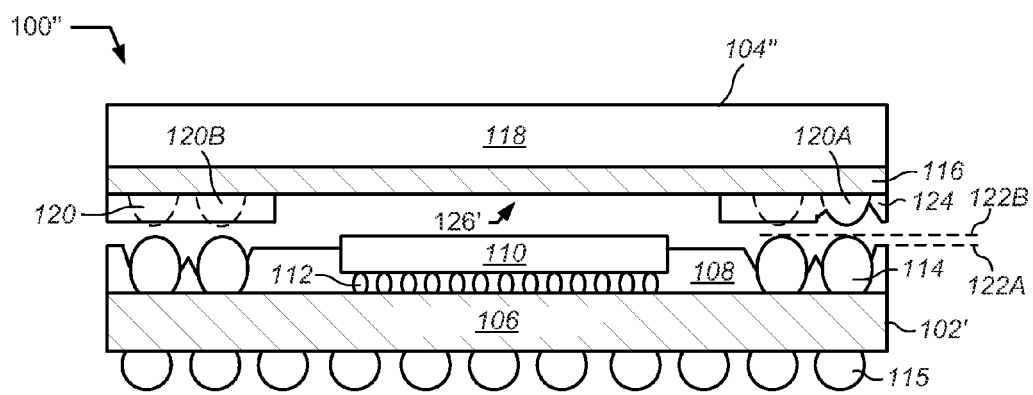
FIG. 4 depicts a cross-sectional representation of an alternative embodiment of a PoP package assembly system.
Figure 5:
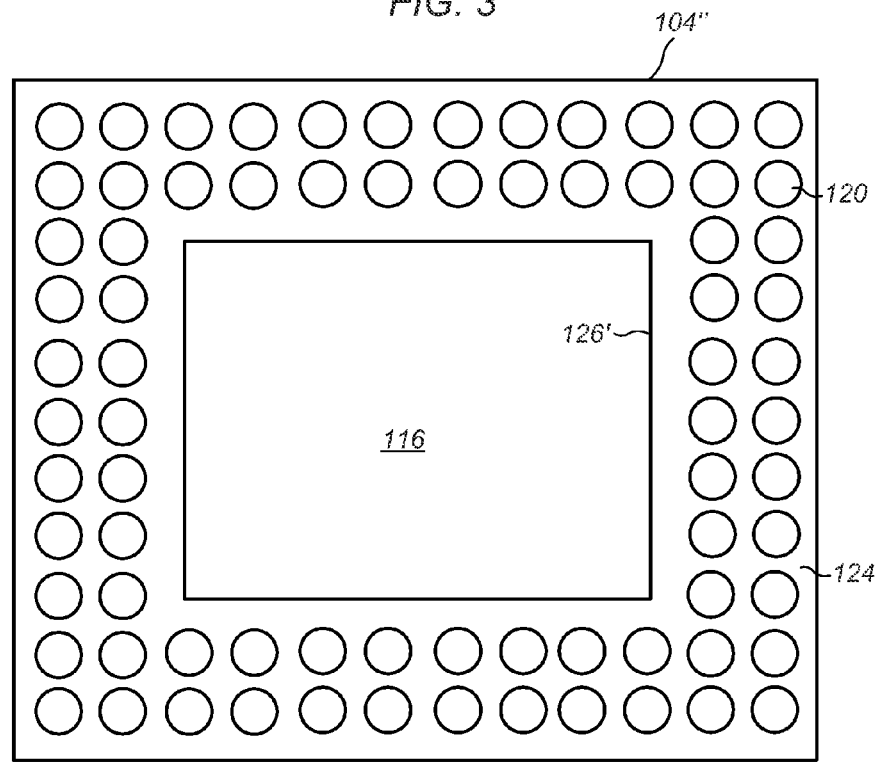
FIG. 5 depicts a bottom-view representation of a top package with a substrate exposed in a recess.

In certain embodiments, as shown in FIG. 2, recess 126 is formed with at least some encapsulation 124 left in the recess (e.g., encapsulant 124 substantially covers or encloses substrate 116 in the recess and the substrate is not exposed in the recess). In some embodiments, the top package substrate is exposed in the recess. FIG. 4 depicts a cross-sectional representation of an embodiment of PoP ("package-on-package") package assembly system 100". As shown in FIG. 4, top package 104" includes encapsulant 124 with recess 126'. Substrate 116 is at least partially exposed in recess 126'. In certain embodiments, substrate 116 is substantially exposed in recess 126'. FIG. 5 depicts a bottom-view representation of top package 104" with substrate 116 exposed in recess 126'.

Figure 6:
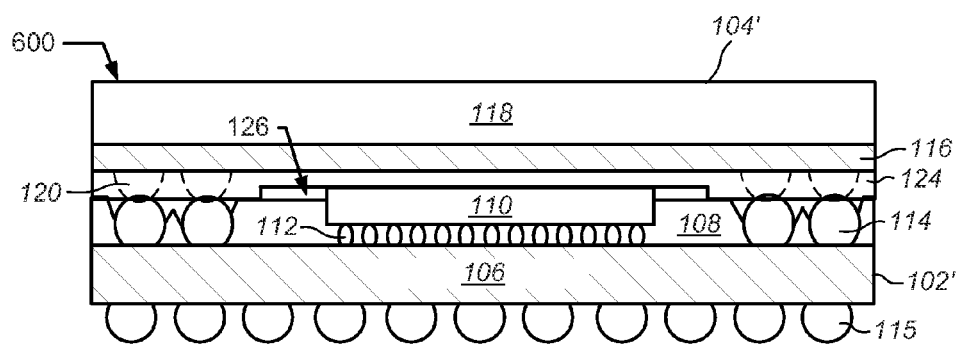
FIG. 6 depicts a cross-sectional representation of an embodiment of a PoP package formed when a bottom package is coupled to a top package.

In certain embodiments, recess 126 (or recess 126') is sized to accommodate the exposed portion of die 110 when top package 104' (or top package 104") is coupled to bottom package 102'. FIG. 6 depicts a cross-sectional representation of an embodiment of PoP package 600 formed when bottom package 102' is coupled to top package 104'. As shown in FIG. 6, accommodating die 110 in recess 126 (or recess 126') reduces the overall thickness of PoP package 600.

In certain embodiments, as shown in FIGS. 2 and 4, at least some parts of terminals 120 are exposed above encapsulant 124. Terminals 120 may be exposed to allow interconnection between terminals 120 and terminals 114 when top package 104' (or top package 104") is coupled to the bottom package, as shown in FIG. 6.

In some embodiments, terminals 120 are first covered by encapsulant 124 when the encapsulant is applied to substrate 116 and then a portion of the encapsulant is removed to expose portions of the terminals. For example, terminals 120 may be exposed in a cavity using techniques such as, but not limited to, laser drilling/ablation to expose portions of the terminals. Terminal 120A, shown in FIGS. 2 and 4, depicts an example of a terminal exposed by cavity-type processing. In some embodiments, portions of terminals 120 are exposed using flat-type processing such as, but not limited to, mechanical grinding/cutting processing. Terminal 120B, shown in FIGS. 2 and 4, depicts an example of a terminal exposed by flat-type processing. In some embodiments, a film assistance mold (FAM) process is used to form encapsulant 124 in a mold shape that exposes portions of terminals 120 (e.g., the mold shape has cavities for the terminals or is flat but exposes portions of the terminals).

Terminals 114 may have a higher height than encapsulant 108 to ensure connection between the terminals in bottom package 102' and terminals (e.g., terminals 120) in top package 104'.

As described above for the embodiments shown in FIGS. 2-6, at least partially covering the bottom (backside) of top package 104' (or top package 104") with encapsulant 124 in addition to covering the top (frontside) of the top package with encapsulant 118 may create a top package structure with substantially balanced thermal properties (e.g., having encapsulant on the backside and the frontside of the top package balances thermal properties such as, but not limited to, CTE and shrinkage rate in the top package). Balancing of the thermal properties in the top package may balance thermal stresses on the top package and reduce or inhibit warping in the top package, especially for top packages with thin or coreless substrates. Reducing warping in the top package may improve pre-stacking and improve the reliability of a PoP package that has fine pitch (e.g., reduced pitch between terminals) and thin or coreless substrates. In addition, accommodating the die from the bottom package in recess 126 (or recess 126') in encapsulant 124 allows the PoP package to maintain a reduced (or thin) overall PoP package thickness.

Embodiments described herein describe a structure and a method for forming a PoP package with a top package having encapsulant on both sides of the top package. It would be apparent to those skilled in the art, however, that the embodiments described herein may be applied to the bottom package for use with surface mount technology (SMT) on a printed circuit board and/or in a module/system level assembly.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A semiconductor device package assembly, comprising:
    a first substrate with a first encapsulant at least partially covering a top of the first substrate;
    a die coupled to the top of the first substrate, wherein the die is at least partially encapsulated in the first encapsulant with at least a portion of the die being exposed above the first encapsulant; and
    a second substrate with a second encapsulant at least partially covering a top of the second substrate and a third encapsulant at least partially covering a bottom of the second substrate;
    wherein the bottom of the second substrate is coupled to the top of the first substrate; and
    wherein at least part of the die is located in a recess in the third encapsulant.

2. The assembly of claim 1, wherein the first substrate and the second substrate are coreless substrates.

3. The assembly of claim 1, wherein the third encapsulant substantially covers the bottom of the second substrate in the recess.

4. The assembly of claim 1, wherein at least a portion of the second substrate is exposed in the recess.

5. The assembly of claim 1, further comprising one or more first terminals coupled to the top of the first substrate, wherein at least some portions of the first terminals are exposed above the first encapsulant.

6. The assembly of claim 1, further comprising one or more second terminals coupled to the bottom of the second substrate, wherein at least some portions of the second terminals are exposed below the third encapsulant.

7. The assembly of claim 1, wherein the bottom of the second substrate is coupled to the top of the first substrate through one or more terminals.

8. A semiconductor device package assembly, comprising:
    a bottom package comprising a first substrate with a first encapsulant above the first substrate;
    a die located above the first substrate and coupled to the first substrate, wherein the die is at least partially encapsulated in the first encapsulant above the first substrate with at least a portion of the die being exposed outside the first encapsulant; and
    a top package coupled to the bottom package, wherein the top package comprises a second substrate with a second encapsulant above the second substrate and a third encapsulant below the second substrate, and wherein the third encapsulant comprises a recess in which at least part of the exposed portion of the die is located.

9. The assembly of claim 8, wherein the first substrate and the second substrate are less than about 400 μm in thickness.

10. The assembly of claim 8, wherein the third encapsulant substantially encloses the second substrate in the recess.

11. The assembly of claim 8, wherein at least a portion of the second substrate is exposed in the recess.

12. The assembly of claim 8, further comprising one or more terminals, wherein the terminals coupled the first substrate to the die.

13. A method for forming a semiconductor device package assembly, comprising:
    coupling a die to a top surface of a first substrate;
    encapsulating the top surface of the first substrate in a first encapsulant, wherein at least a portion of the die is exposed above the first encapsulant;
    encapsulating a top surface of a second substrate in a second encapsulant;

encapsulating a bottom surface of the second substrate in a third encapsulant, wherein the third encapsulant comprises a recess; and coupling the top surface of the first substrate to the bottom surface of the second substrate such that at least part of the die is located in the recess in the third encapsulant.

14. The method of claim 13, further comprising molding the third encapsulant to form the recess.

15. The method of claim 13, further comprising removing a portion of the third encapsulant to form the recess.

16. The method of claim 13, further comprising coupling one or more first terminals to the top surface of the first substrate, wherein at least some portions of the first terminals are exposed above the first encapsulant.

17. The method of claim 13, further comprising coupling one or more second terminals to the bottom surface of the second substrate, wherein at least some portions of the second terminals are exposed below the third encapsulant.

18. The method of claim 13, further comprising coupling one or more first terminals coupled to the top of surface of the first substrate to one or more second terminals coupled to the bottom surface of the second substrate.

19. A semiconductor device package assembly system, comprising:

a bottom package configured to be coupled to a top package;

the bottom package comprising:

a first substrate with a first encapsulant above the first substrate;

a die located above the first substrate and coupled to the first substrate, wherein the die is at least partially encapsulated in the first encapsulant above the first substrate with at least a portion of the die being exposed outside the first encapsulant; and one or more first terminals coupled to the first substrate, wherein at least some portions of the first terminals are exposed above the first encapsulant;

the top package comprising:

a second substrate with a second encapsulant above the second substrate and a third encapsulant below the second substrate, wherein the third encapsulant comprises a recess in which at least a portion of the die is located when the top package is coupled to the bottom package; and one or more second terminals coupled to the second substrate, wherein at least some portions of the second terminals are exposed below the third encapsulant.

20. The system of claim 19, wherein the first substrate and the second substrate are coreless substrates.

21. The system of claim 19, wherein the third encapsulant substantially encloses the second substrate in the recess.

22. The system of claim 19, wherein at least a portion of the second substrate is exposed in the recess.

23. The system of claim 19, wherein at least some of the second terminals contact at least some of the first terminals when the top package is coupled to the bottom package.

* * * * *